(12) United States Patent
Hsieh

(10) Patent No.: US 8,426,984 B2
(45) Date of Patent: Apr. 23, 2013

(54) SUBSTRATE STRUCTURE WITH COMPLIANT BUMP AND MANUFACTURING METHOD THEREOF

(75) Inventor: Chin-Tang Hsieh, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 13/231,199

(22) Filed: Sep. 13, 2011

(65) Prior Publication Data

US 2013/0062756 A1    Mar. 14, 2013

(51) Int. Cl.
*H01L 23/48* (2006.01)
*H01L 23/52* (2006.01)

(52) U.S. Cl.
USPC .......... 257/784; 257/737; 257/738; 257/780; 257/786; 438/613

(58) Field of Classification Search .......... 257/737–738, 257/780, 784, 786, E23.048; 438/613
See application file for complete search history.

(56) References Cited

U.S. PATENT DOCUMENTS 7,081,681 B2 *   7/2006   Suzuki .......................... 257/784

* cited by examiner

*Primary Examiner* — Theresa T Doan
(74) *Attorney, Agent, or Firm* — Jackson IPG PLLC

(57) ABSTRACT

A substrate structure with compliant bump comprises a substrate, a plurality of bumps, and a metallic layer, wherein the substrate comprises a surface, a trace layer, and a protective layer. The trace layer comprises a plurality of conductive pads, and each of the conductive pads comprises an upper surface. The protective layer comprises a plurality of openings. The bumps are formed on the surface, and each of the bumps comprises a top surface, an inner surface and an outer surface and defines a first body and a second body. The first body is located on the surface. The second body is located on top of the first body. The metallic layer is formed on the top surface, the inner surface, and the upper surface.

8 Claims, 5 Drawing Sheets

SUBSTRATE STRUCTURE WITH COMPLIANT BUMP AND MANUFACTURING METHOD THEREOF

FIELD OF THE INVENTION

The present invention is generally relating to a substrate structure, more particularly to the substrate structure having compliant bump.

BACKGROUND OF THE INVENTION

A conventional substrate with bump 10 includes a Si-substrate 11 and a gold bump 12 as shown in FIG. 1. The Si-substrate 11 comprises a surface 11a, an aluminum pad 11b formed on the surface 11a, and a protective layer 11c covering the aluminum pad 11b, wherein the protective layer 11c comprises an opening 11d to reveal the aluminum pad 11b, and the gold bump 12 is disposed on the aluminum pad 11b. Owing to the reason that the bump material of the substrate with bump 10 is gold, mentioned bump structure may lead a higher production cost and bring on a relatively poor economic benefit.

SUMMARY

The primary object of the present invention is to provide a substrate structure with compliant bump comprising a substrate, a plurality of insulating bumps, and a metallic layer. The substrate comprises a surface, a trace layer formed on the surface, and a protective layer covering the trace layer, wherein the trace layer comprises a plurality of conductive pads, each of the conductive pads comprises an outer lateral wall and an upper surface, the protective layer comprises a plurality of openings, and each of the openings reveals each of the conductive pads. Each of the openings comprises an inner lateral wall, and a first accommodating space is formed between the inner lateral wall and the outer lateral wall. The insulating bumps are formed on the surface and located at the first accommodating space. Each of the insulating bumps comprises a top surface, an inner surface, and an outer surface and defines a first body and a second body. The first body is located on the surface and comprises a first width, and the second body is located on top of the first body and protrudes from the protective layer. A second width is formed between the inner lateral wall and the outer lateral wall, and mentioned second width is not smaller than the first width. The metallic layer is formed on the top surface of each of the insulating bumps, the inner surface, and the upper surface of each of the conductive pads. Accordingly, the substrate structure with compliant bump introduces the insulating bumps to replace conventional gold bumps, and forms the metallic layer on the insulating bumps for achieving the purpose of electric connection. Therefore, mentioned substrate structure with compliant bump may lower production cost.

DETAILED DESCRIPTION OF THE INVENTION

Figure 1:
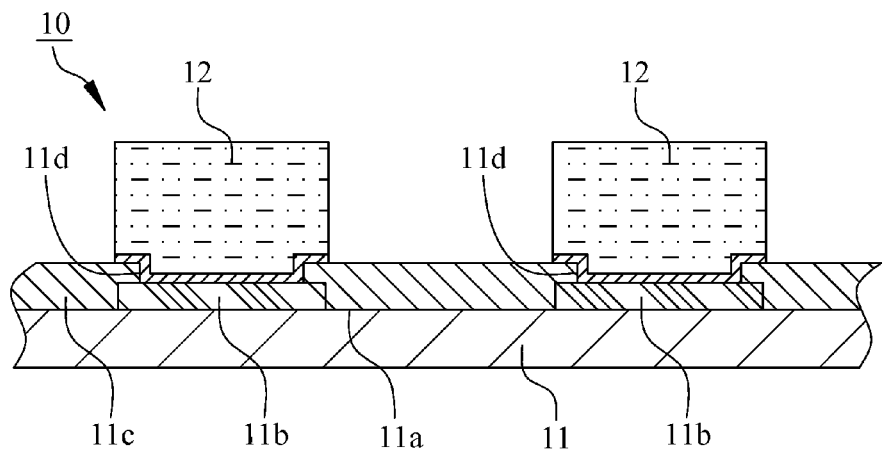
FIG. 1 is a schematic diagram illustrating a conventional substrate structure with bump.
Figure 2:
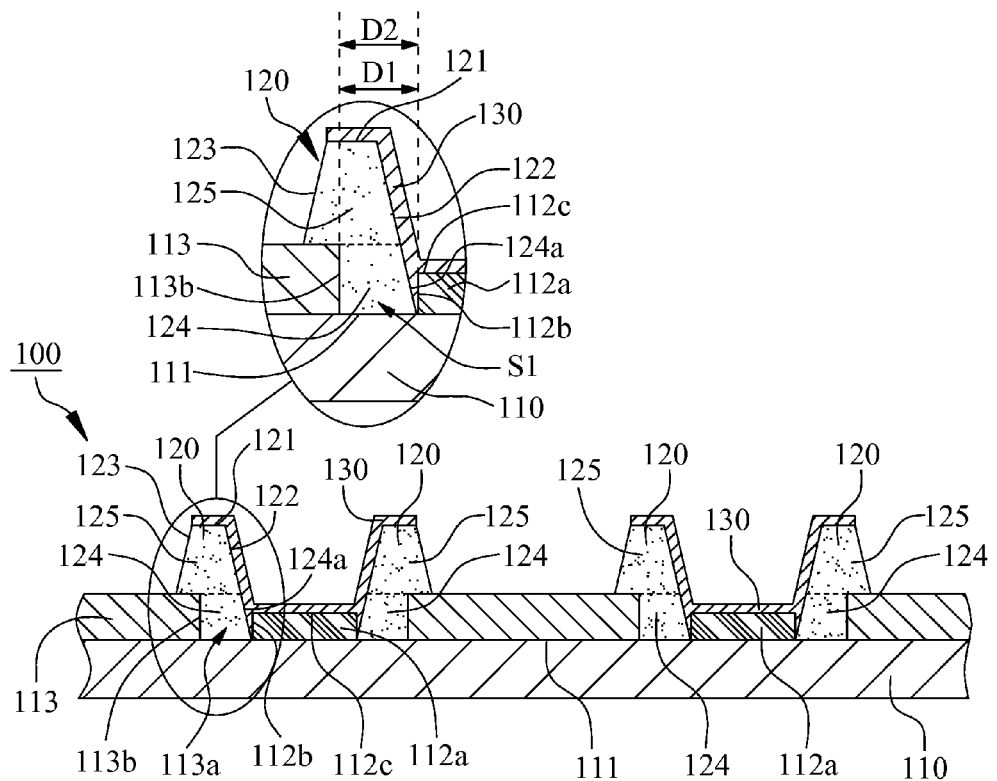
FIG. 2 is a schematic diagram illustrating a substrate structure with compliant bump in accordance with a first preferred embodiment of the present invention.
Figure 3:
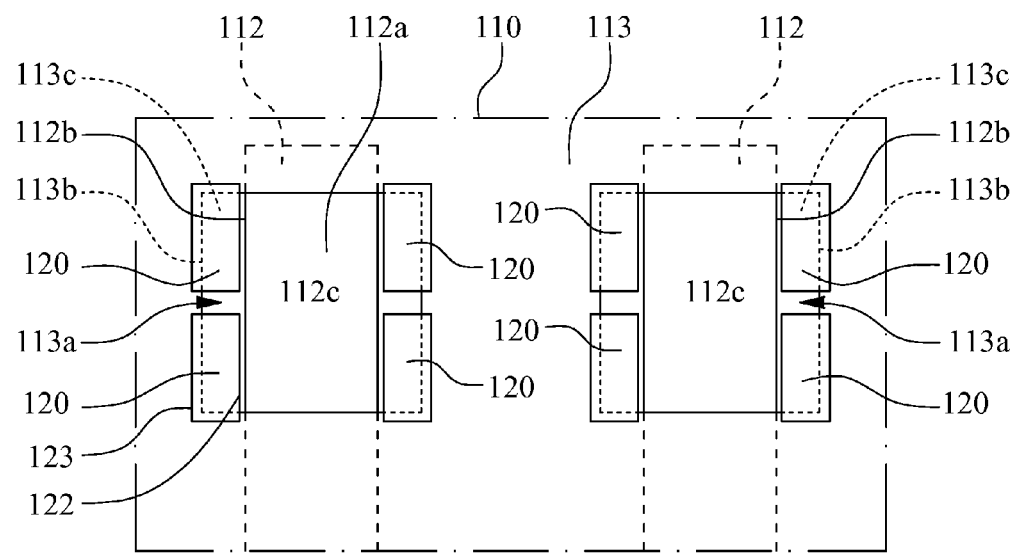
FIG. 3 is a top view illustrating the substrate structure with compliant bump in accordance with a first preferred embodiment of the present invention.
Figure 4:
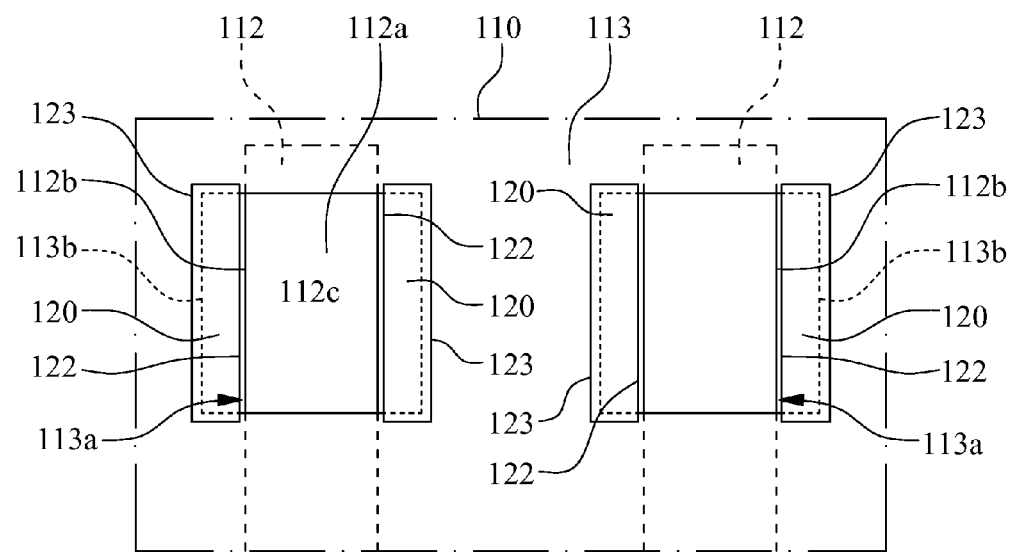
FIG. 4 is a top view illustrating another substrate structure with compliant bump in accordance with a second preferred embodiment of the present invention.

Please refers to FIG. 2, a substrate structure with compliant bump 100 in accordance with a first preferred embodiment of the present invention comprises a substrate 110, a plurality of insulating bumps 120, and a metallic layer 130. With reference to FIGS. 2 and 3, the substrate 110 comprises a surface 111, a trace layer 112 formed on the surface 111, and a protective layer 113 covering the trace layer 112, wherein the trace layer 112 comprises a plurality of conductive pads 112a, and each of the conductive pads 112a comprises an outer lateral wall 112b and an upper surface 112c. The protective layer 113 comprises a plurality of openings 113a, and each of the openings 113a reveals each of the conductive pads 112a and comprises an inner lateral wall 113b. A first accommodating space 51 is formed between the inner lateral wall 113b and the outer lateral wall 112b, and the insulating bumps 120 are formed on the surface 111 and located at the first accommodating space S1. In this embodiment, each of the openings 113a comprises a plurality of corners 113c, and each of the insulating bumps 120 is located at one of the corners 113c. Or, with reference to FIG. 4, in the second preferred embodiment, adjacent insulating bumps 120 are interconnected therefore forming larger-sized insulating bump 120.

Figure 5:
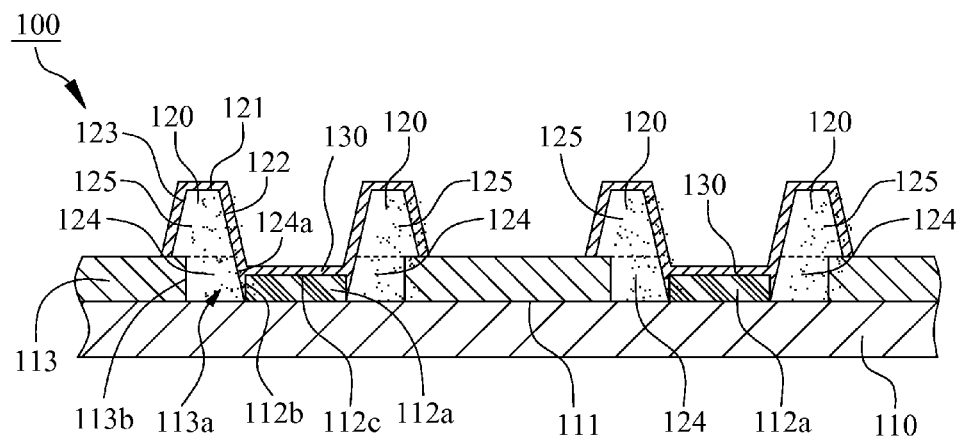
FIG. 5 is a schematic diagram illustrating another substrate structure with compliant bump in accordance with a third preferred embodiment of the present invention.

Referring to FIGS. 2 and 3 again, in this embodiment, the material of the substrate 110 can be chosen from one of glass substrate, silicon substrate, ceramic substrate, or printed circuit board. Each of the insulating bumps 120 comprises a top surface 121, an inner surface 122, and an outer surface 123 and defines a first body 124 and a second body 125, wherein the first body 124 is located on the surface 111 and comprises a first width D1, the second body 125 is located on top of the first body 124 and protrudes from the protective layer 113. In this embodiment, the second body 125 is extendedly formed at the protective layer 113. Besides, a second width D2 is formed between the inner lateral wall 113b and the outer lateral wall 112b, and the second width D2 is not smaller than the first width D1. In this embodiment, the second width D2 is equal to the first width D1. The metallic layer 130 is formed on the top surface 121, the inner surface 122 of each of the insulating bumps 120, and the upper surface 112c of each of the conductive pads 112a. Or, referring to FIG. 5, in the third preferred embodiment, the metallic layer 130 is formed on the outer surface 123 of the insulating bump 120.

Figure 6:
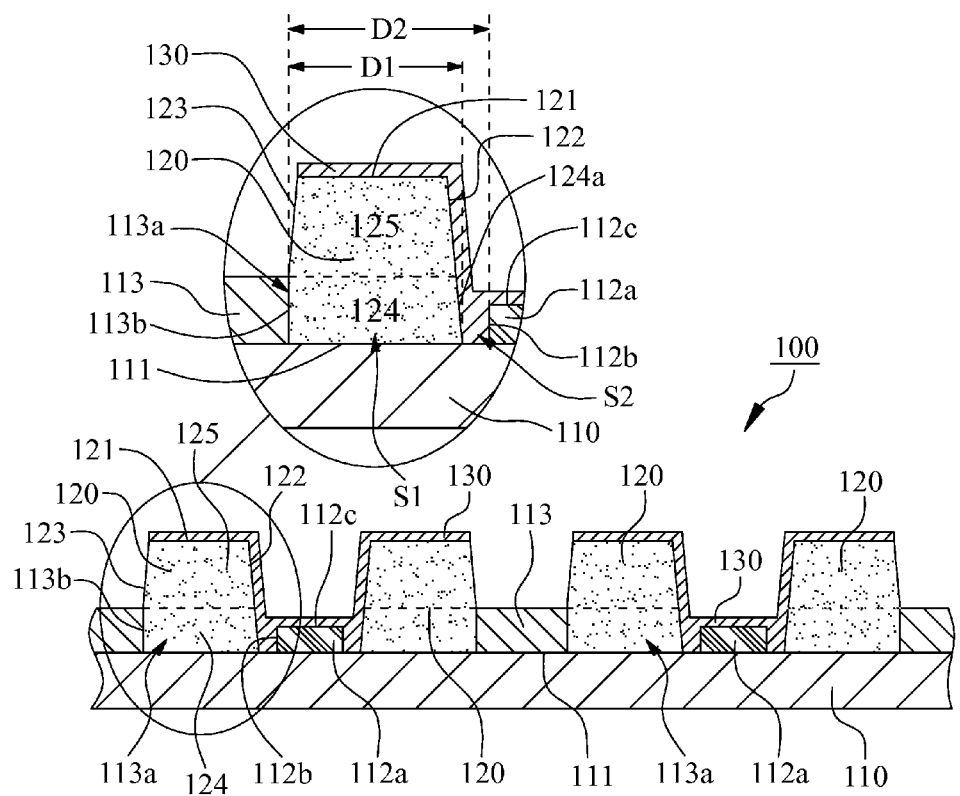
FIG. 6 is a schematic diagram illustrating another substrate structure with compliant bump in accordance with a fourth preferred embodiment of the present invention.
Figure 7:
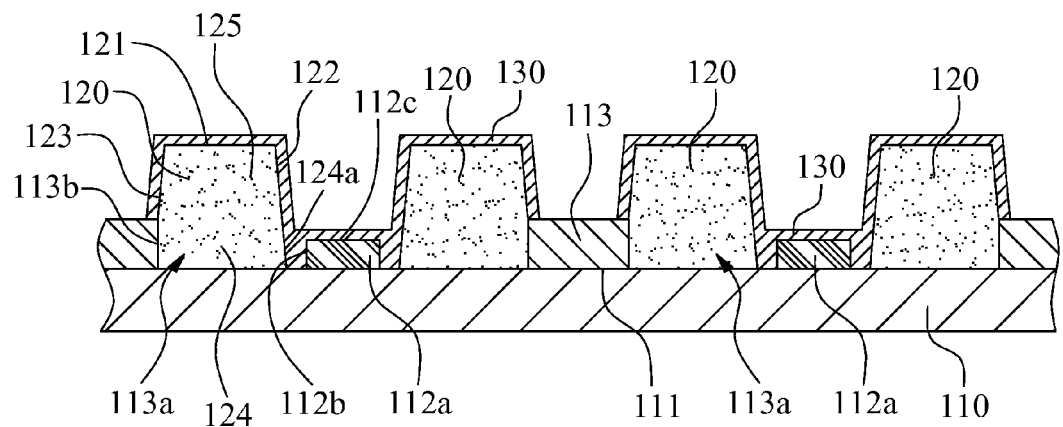
FIG. 7 is a schematic diagram illustrating another substrate structure with compliant bump in accordance with a fifth preferred embodiment of the present invention.

With reference to FIG. 6, in the fourth preferred embodiment, the second width D2 is larger than the first width D1. The first body 124 comprises a first internal surface 124a, and a second accommodating space S2 is formed between the first internal surface 124a and the outer lateral wall 112b of the conductive pad 112a. The metallic layer 130 is formed at the outer lateral wall 112b of the conductive pad 112a and the second accommodating space S2. In this embodiment, the metallic layer 130 further forms on the surface 111 of the substrate 110, or, with reference to FIG. 7, the metallic layer 130 further forms on the outer surface 123 of the insulating bump 120. Accordingly, the substrate structure with compliant bump 100 introduces the insulating bumps 120 to replace conventional gold bumps and forms the metallic layer 130 on the insulating bumps 120 for achieving the purpose of electric connection. Therefore, mentioned substrate structure with compliant bump 100 may lower production cost.

Figure 8A:
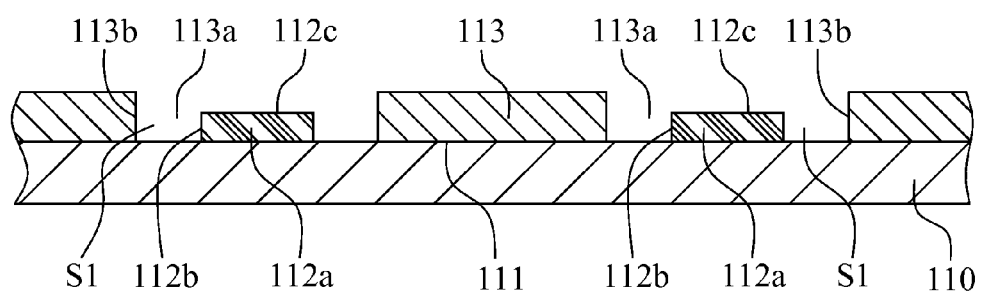
FIGS. 8A to 8E are sectional diagrams illustrating a manufacturing method of the substrate structure with compliant bump in accordance with a first preferred embodiment of the present invention.
Figure 8B:
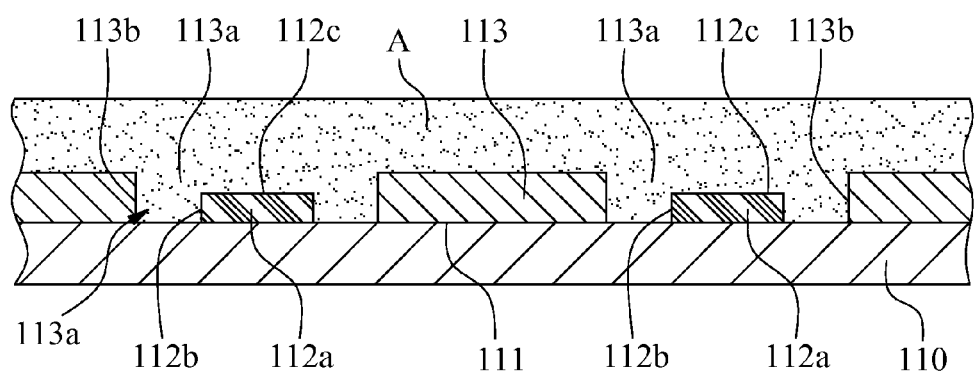
Figure 8C:
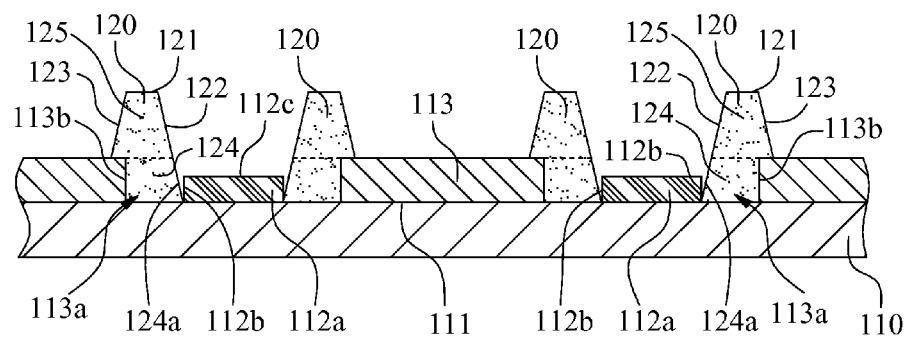
Figure 8D:
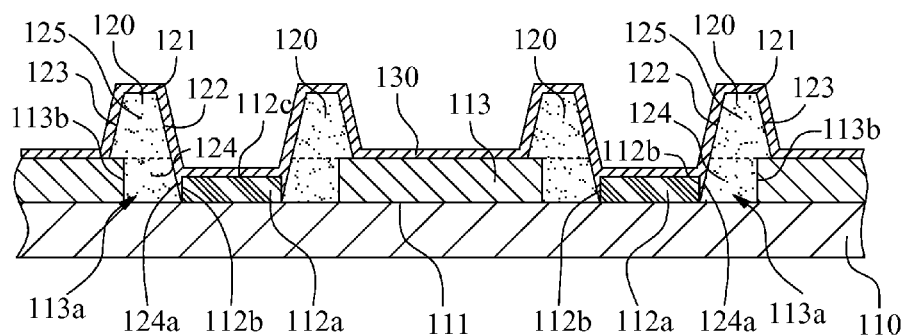
Figure 8E:
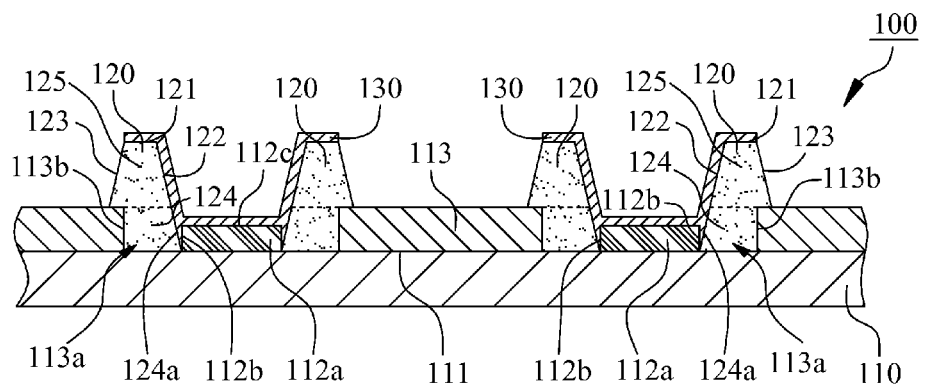

Referring to FIGS. 8A to 8E, a manufacturing method of the substrate structure with compliant bump in accordance with the first preferred embodiment comprises the following steps of: first, with reference to FIGS. 3 and 8A, providing a substrate 110 having a surface 111, a trace layer 112 formed on the surface 111, and a protective layer 113 covering the trace layer 112, wherein the trace layer 112 comprises a plurality of conductive pads 112a, each of the conductive pads 112a comprises an outer lateral wall 112b and a upper surface 112c, the protective layer 113 comprises a plurality of openings 113a, each of the openings 113a reveals each of the conductive pads 112a and comprises an inner lateral wall 113b, a first accommodating space S1 is formed between the inner lateral wall 113b and the outer lateral wall 112b, and the material of the substrate 110 can be chosen from one of glass substrate, silicon substrate, ceramic substrate, and printed circuit board; next, with reference to FIG. 8B, forming a photoresist layer A on the surface 111 of the substrate 110 and covering the trace layer 112 and the protective layer 113 with the photoresist layer A; thereafter, referring to FIG. 8C, patterning the photoresist layer A to form a plurality of insulating bumps 120, mentioned insulating bumps 120 are formed on the surface 111 and located at the first accommodating space S1, each of the insulating bumps 120 comprises a top surface 121, an inner surface 122, and an outer surface 123 and defines a first body 124 and a second body 125, wherein the first body 124 is located on the surface 111 and comprises a first width D1, the second body 125 is located on top of the first body 124 and protrudes from the protective layer 113, a second width D2 is formed between the inner lateral wall 113b and the outer lateral wall 112b, mentioned second width D2 is not smaller than the first width D1, in this embodiment, the second width D2 is equal to the first width D1; afterwards, with reference to FIG. 8D, forming a metallic layer 130 on the top surface 121, the inner surface 122, the outer surface 123 of each of the insulating bumps 120, the protective layer 113 and the upper surface 112c of each of the conductive pads 112a; eventually, referring to FIG. 8E, removing the metallic layer 130 located at the protective layer 113 and the outer surface 123 of the insulating bump 120 therefore forming a substrate structure with compliant bump 100.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A substrate structure with compliant bump comprising:
   a substrate having a surface,
   a trace layer formed on the surface, and
   a protective layer covering the trace layer, wherein the trace layer comprises a plurality of conductive pads, each of the conductive pads comprises an outer lateral wall and an upper surface, the protective layer comprises a plurality of openings, each of the openings reveals each of the conductive pads and comprises an inner lateral wall, wherein a first accommodating space is formed between the inner lateral wall and the outer lateral wall;
   a plurality of insulating bumps formed on the surface and located at the first accommodating space, wherein the plurality of insulating bumps and the protective layer are not one-piece and wherein each of the insulating bumps comprises a top surface, an inner surface, and an outer surface and defines a first body and a second body, wherein the first body is located on the surface and comprises a first width, the second body is located on top of the first body and protrudes from the protective layer, a second width is formed between the inner lateral wall and the outer lateral wall, and the second width is not smaller than the first width; and
   a metallic layer formed on the top surface, the inner surface of the insulating bump, and the upper surface of the conductive pad.

2. The substrate structure with compliant bump in accordance with claim 1, wherein the metallic layer is formed on the outer surface of the insulating bump.

3. The substrate structure with compliant bump in accordance with claim 1, wherein the second width is larger than the first width, the metallic layer is formed at the outer lateral wall of the conductive pad.

4. The substrate structure with compliant bump in accordance with claim 3, wherein the first body comprises a first internal surface, a second accommodating space is formed between the first internal surface and the outer lateral wall of the conductive pad, the metallic layer is formed at the second accommodating space.

5. The substrate structure with compliant bump in accordance with claim 3, wherein the metallic layer is formed on the surface of the substrate.

6. The substrate structure with compliant bump in accordance with claim 1, wherein each of the openings comprises a plurality of corners, and each of the insulating bumps is located at one of the corners.

7. The substrate structure with compliant bump in accordance with claim 1, wherein adjacent insulating bumps are interconnected.

8. The substrate structure with compliant bump in accordance with claim 1, wherein the second body is extendedly formed at the protective layer.

* * * * *